United States Patent
Lichtenwalner et al.

(10) Patent No.: US 10,910,481 B2
(45) Date of Patent: Feb. 2, 2021

(54) SEMICONDUCTOR DEVICE WITH IMPROVED INSULATED GATE

(71) Applicant: Cree, Inc., Durham, NC (US)

(72) Inventors: Daniel Jenner Lichtenwalner, Raleigh, NC (US); Lin Cheng, Chapel Hill, NC (US); John Williams Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 268 days.

(21) Appl. No.: 14/533,688

(22) Filed: Nov. 5, 2014

(65) Prior Publication Data

US 2016/0126333 A1 May 5, 2016

(51) Int. Cl.
*H01L 29/51* (2006.01)
*H01L 29/78* (2006.01)
(Continued)

(52) U.S. Cl.
CPC ........ *H01L 29/513* (2013.01); *H01L 29/1033* (2013.01); *H01L 29/1608* (2013.01);
(Continued)

(58) Field of Classification Search
CPC ........... H01L 21/28229; H01L 21/0223; H01L 21/02236; H01L 21/02244; H01L 21/02238; H01L 29/513; H01L 29/66068; H01L 29/66477; H01L 29/1608; H01L 29/2003; H01L 29/78; H01L 29/517; H01L 29/1033; H01L 29/20
See application file for complete search history.

(56) References Cited

U.S. PATENT DOCUMENTS 5,989,962 A 11/1999 Holloway et al.
6,087,229 A * 7/2000 Aronowitz .......... H01L 21/0214
257/324
(Continued)

FOREIGN PATENT DOCUMENTS

JP 63237565 A * 10/1988 ............. H01L 29/78

OTHER PUBLICATIONS

Alén et al., "Diffusion Barrier Properties of Atomic Layer Deposited Ultrathin Ta2O5 and TiO2 Films", Journal of the Electrochemical Society, 153 (4), G30-G308, © 2006.*
(Continued)

*Primary Examiner* — Stephen W Smoot
*Assistant Examiner* — Sun Mi Kim King
(74) *Attorney, Agent, or Firm* — Withrow & Terranova, P.L.L.C.

(57) ABSTRACT

A semiconductor device includes a semiconductor body and an insulated gate contact on a surface of the semiconductor body over an active channel in the semiconductor device. The insulated gate contact includes a channel mobility enhancement layer on the surface of the semiconductor body, a diffusion barrier layer over the channel mobility enhancement layer, and a dielectric layer over the diffusion barrier layer. By using the channel mobility enhancement layer in the insulated gate contact, the mobility of the semiconductor device is improved. Further, by using the diffusion barrier layer, the integrity of the gate oxide is retained, resulting in a robust semiconductor device with a low on-state resistance.

19 Claims, 40 Drawing Sheets

(51) Int. Cl.
  *H01L 29/66* (2006.01)
  *H01L 29/16* (2006.01)
  *H01L 29/20* (2006.01)
  *H01L 29/10* (2006.01)

(52) U.S. Cl.
  CPC ........ *H01L 29/2003* (2013.01); *H01L 29/517* (2013.01); *H01L 29/66068* (2013.01); *H01L 29/66712* (2013.01); *H01L 29/7802* (2013.01)

(56) References Cited

U.S. PATENT DOCUMENTS

| | | | | |
|---|---|---|---|---|
| 6,815,299 | B2* | 11/2004 | Kiritani | H01L 21/02164 257/E21.063 |
| 7,157,778 | B2* | 1/2007 | Moore | H01L 21/3145 257/392 |
| 7,279,413 | B2* | 10/2007 | Park | H01L 21/28088 257/E21.194 |
| 2002/0197789 | A1 | 12/2002 | Buchanan et al. | |
| 2008/0119057 | A1* | 5/2008 | Chua | H01L 21/28185 438/763 |
| 2010/0044806 | A1 | 2/2010 | Hou et al. | |
| 2011/0147764 | A1 | 6/2011 | Dhar et al. | |
| 2012/0223330 | A1 | 9/2012 | Dhar et al. | |
| 2012/0326163 | A1 | 12/2012 | Dhar et al. | |
| 2012/0329216 | A1 | 12/2012 | Dhar et al. | |
| 2013/0034941 | A1 | 2/2013 | Dhar et al. | |
| 2013/0299914 | A1* | 11/2013 | Kim | H01L 27/092 257/369 |
| 2014/0077227 | A1 | 3/2014 | Williams et al. | |
| 2014/0252469 | A1* | 9/2014 | Lee | H01L 29/66431 257/337 |
| 2015/0255560 | A1* | 9/2015 | Henry | H01L 29/475 257/76 |

OTHER PUBLICATIONS

Bondoux, Céline, et al., "MgO insulating films prepared by sol-gel route for SiC substrate," Journal of the European Ceramic Society, vol. 25, Issue 12, May 25, 2005, Elsevier Ltd., pp. 2795-2798.

Tan, J., et al., "Metal-oxide-semiconductor capacitors formed by oxidation of polycrystalline silicon on SiC," Applied Physics Letters, vol. 70, Issue 17, Feb. 28, 1997, West Lafayette, Indiana, American Institute of Physics, pp. 2280-2281.

International Search Report and Written Opinion for International Patent Application No. PCT/US2015/055771, dated Jun. 15, 2016, 16 pages.

International Preliminary Report on Patentability for International Patent Application No. PCT/US2015/055771, dated May 18, 2017, 10 pages.

Examination Report for European Patent Application No. 15853627.6, dated Jan. 13, 2020, 7 pages.

Notice of Intention to Grant for European Patent Application No. 15853627.6, dated Jun. 19, 2020, 13 pages.

\* cited by examiner

SEMICONDUCTOR DEVICE WITH IMPROVED INSULATED GATE

GOVERNMENT SUPPORT

This invention was made with government funds under contract number W911NF-12-2-0064 awarded by The U.S. Army Research Laboratory. The U.S. Government may have rights in this invention.

FIELD OF THE DISCLOSURE

The present disclosure relates to insulated gate semiconductor devices and methods for manufacturing the same.

BACKGROUND

Semiconductor devices such as transistors are ubiquitous in modern electronic devices. Due to the physical limits of silicon (Si) devices, wide bandgap semiconductor material systems such as gallium arsenide (GaAs), gallium nitride (GaN), and silicon carbide (SiC) are being explored in order to push the boundaries of device performance in areas such as switching speed, power handling capability, and thermal conductivity. Further, insulated gate transistor structures such as metal-oxide-semiconductor field-effect transistors (MOSFETs) and insulated gate bipolar transistors (IGBTs) are widely used due to their high switching speeds, high input impedances, and high power handling capabilities. While the benefits of a wide bandgap material system can be combined with those of an insulated gate structure, such a combination often results in low channel mobility when using conventional manufacturing processes, as discussed below. Low channel mobility is associated with high on-state resistance and thus large conduction losses, which significantly degrade the efficiency of a semiconductor device.

FIGS. 1 and 2A-2C illustrate a conventional process for manufacturing a wide bandgap semiconductor device including an insulated gate contact. First, a wide bandgap semiconductor body 12 is provided (step 100 and FIG. 2A). The wide bandgap semiconductor body 12 is then exposed to heat in an oxidizing ambient to oxidize a first surface 14 of the wide bandgap semiconductor body 12, resulting in a gate oxide layer 16 (step 102 and FIG. 2B). In the process of oxidizing the first surface 14 of the wide bandgap semiconductor body 12, a number of defects 18 are formed at the interface between the gate oxide layer 16 and the wide bandgap semiconductor body 12. These defects 18 trap charge carriers in the wide bandgap semiconductor device, thereby significantly decreasing the channel mobility of the device. A gate electrode 20 is then provided on top of the gate oxide layer 16 over a channel 22 in the wide bandgap semiconductor body 12 to form an insulated gate contact (step 104 and FIG. 2C). One or more additional steps, such as an annealing of the gate oxide layer 16 before deposition of the gate electrode 20, may be performed on the insulated gate contact, which may produce further defects 18 at the interface between the gate oxide layer 16 and the wide bandgap semiconductor body 12.

FIGS. 3 and 4A-4D illustrate an alternative conventional process for manufacturing the wide bandgap semiconductor device. First, the wide bandgap semiconductor body 12 is provided (step 200 and FIG. 4A). The gate oxide layer 16 is then deposited on the first surface 14 of the wide bandgap semiconductor body 12 (step 202 and FIG. 4B). While the resulting gate oxide layer 16 is relatively free of defects 18 due to the use of a deposition process rather than an oxidation process, a subsequent annealing step in which the wide bandgap semiconductor device is exposed to heat in order to densify the gate oxide layer 16 and improve the dielectric strength thereof (step 204 and FIG. 4C) once again produces the defects 18 at the interface of the gate oxide layer 16 and the wide bandgap semiconductor body 12. The gate electrode 20 is then provided on top of the gate oxide layer 16 over the channel 22 in the wide bandgap semiconductor body 12 to form the insulated gate contact (step 206 and FIG. 4D).

FIGS. 5 and 6A-6D illustrate an alternative conventional process for manufacturing the wide bandgap semiconductor device. First, the wide bandgap semiconductor body 12 is provided (step 300 and FIG. 6A). The gate oxide layer 16 is then provided, either via oxidation of the wide bandgap semiconductor body 12 or a deposition process (step 302 and FIG. 6B). An anneal is then performed on the semiconductor device by exposing the gate oxide layer 16 and the wide bandgap semiconductor body 12 to heat (represented by the wavy lines shown in FIG. 6C) in a nitric oxide (NO) ambient (represented by the dots shown in FIG. 6C), which not only increases the density of the gate oxide layer 16 and improves the dielectric strength thereof, but also forms a channel mobility enhancement layer 26 at the interface between the gate oxide layer 16 and the wide bandgap semiconductor body 12 (step 304 and FIG. 6C). The resulting channel mobility enhancement layer 26 is nitrogen (N), which improves the channel mobility of the wide bandgap semiconductor device by preventing charge carriers from being trapped at the interface between the gate oxide layer 16 and the wide bandgap semiconductor body 12 by defects created in the formation or annealing of the gate oxide layer 16. The majority of the nitrogen (N) stays at the interface of the gate oxide layer 16 and the wide bandgap semiconductor body 12, which produces a good gate oxide quality throughout the dielectric. However, this approach results in only moderate values of channel mobility (up to ~30 $cm^2/V \cdot s$), while the theoretical electron channel mobility is expected to be on the order of 100 $cm^2/V \cdot s$ for a more ideal interface. Finally, the gate electrode 20 is provided on top of the gate oxide layer 16 over the channel 22 in the wide bandgap semiconductor body 12 to form the insulated gate contact (step 306 and FIG. 6D).

Accordingly, there is a need for an insulated gate wide bandgap semiconductor device with improved channel mobility, high power handling capability, and high reliability and a process for manufacturing the same.

SUMMARY

The present disclosure relates to insulated gate semiconductor devices and methods for manufacturing the same. In one embodiment, a semiconductor device includes a semiconductor body and an insulated gate contact on a surface of the semiconductor body over an active channel in the semiconductor device. The insulated gate contact includes a channel mobility enhancement layer on the surface of the semiconductor body, a diffusion barrier layer over the channel mobility enhancement layer, and a dielectric layer over the diffusion barrier layer. By using the channel mobility enhancement layer in the insulated gate contact, the channel mobility of the semiconductor device is improved. Further, by using the diffusion barrier layer, the integrity of the gate oxide is retained, resulting in a robust semiconductor device with a low on-state resistance.

In one embodiment, the channel mobility enhancement layer is one of potassium, rubidium, cesium, strontium, barium, lanthanum, scandium, phosphorus, arsenic, antimony, bismuth, vanadium, niobium, and/or tantalum. The diffusion barrier layer may be one of silicon, aluminum, silicon oxide, aluminum oxide, magnesium oxide, silicon nitride, silicon oxy-nitride, or various mixtures of these or similar element, alloys, or dielectrics chemically compatible with the underlying semiconductor and capable of being a good dielectric layer upon oxidation annealing. The semiconductor body may be a wide bandgap semiconductor material.

In one embodiment, the insulated gate contact further includes a gate electrode over the dielectric layer.

In one embodiment, a method of forming an insulated gate contact for a semiconductor device includes the steps of providing a semiconductor body, providing a channel mobility enhancement layer over an active channel in the semiconductor body, providing a diffusion resistant layer over the channel mobility enhancement layer, and oxidizing some or all of the diffusion resistant layer to form the dielectric layer. The diffusion resistant layer may be oxidized, for example, via an annealing process. During the annealing process, the diffusion resistant layer may be chemically converted to a higher quality dielectric (e.g., $Si_3N_4$ may convert to $SiO_2$; Al may convert to $AlSiO_x$), thus serving as a sacrificial barrier that prevents diffusion of byproducts from the channel mobility enhancement layer into the dielectric layer while ultimately forming a high quality dielectric. By using the channel mobility enhancement layer in the insulated gate contact, the mobility of the semiconductor device is improved. Further, by providing and oxidizing the diffusion resistant layer to form a dielectric layer, the purity of the dielectric layer is preserved, thereby increasing the longevity and reliability of the semiconductor device.

In one embodiment, a method of forming an insulated gate contact for a semiconductor device includes the steps of providing a semiconductor body, providing a channel mobility enhancement layer over an active channel in the semiconductor body, providing a diffusion barrier layer over the channel mobility enhancement layer, providing a dielectric layer over the diffusion barrier layer, and annealing the dielectric layer. During the anneal of the dielectric layer, most or all of the diffusion barrier layer may be chemically converted to a higher quality dielectric (e.g., $Si_3N_4$ converting to $SiO_2$; Al converting to $AlSiO_x$), thus serving as a sacrificial barrier that prevents diffusion of byproducts from the channel mobility enhancement layer into the dielectric layer while ultimately forming a high quality dielectric. By using a channel mobility enhancement layer in the insulated gate contact, the mobility of the semiconductor device is improved. Further, by providing the diffusion barrier layer between the channel mobility enhancement layer and the dielectric layer, the purity of the dielectric layer is preserved, thereby increasing the longevity and reliability of the semiconductor device.

In one embodiment, a method of forming an insulated gate contact for a semiconductor device includes the steps of providing a semiconductor body, providing a channel mobility enhancement layer over an active channel in the semiconductor body, providing a diffusion barrier layer over the channel mobility enhancement layer, and providing a dielectric layer over the diffusion barrier layer. By using a channel mobility enhancement layer in the insulated gate contact, the mobility of the semiconductor device is improved. Further, by providing the diffusion barrier layer between the channel mobility enhancement layer and the dielectric layer, the purity of the dielectric layer is preserved, thereby increasing the longevity and reliability of the semiconductor device.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
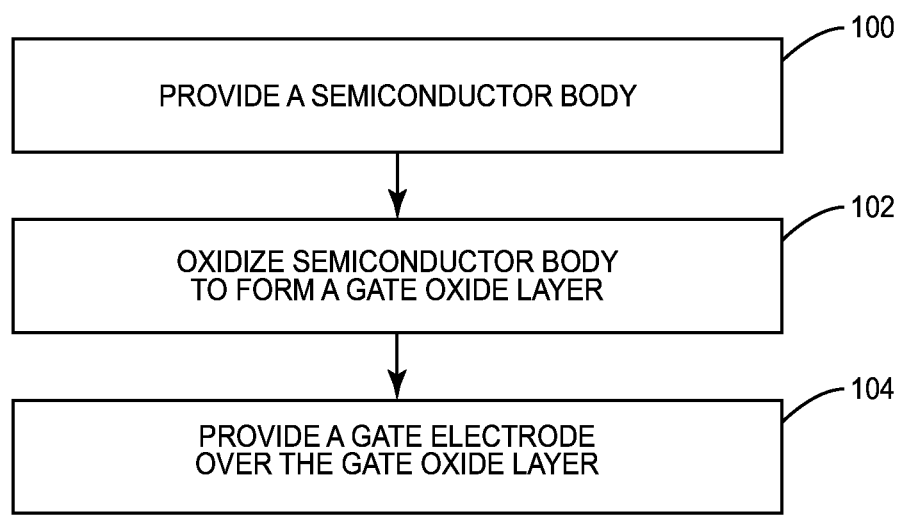
FIG. 1 is a block diagram describing a conventional process for manufacturing an insulated gate contact for a semiconductor device.
Figure 2A:
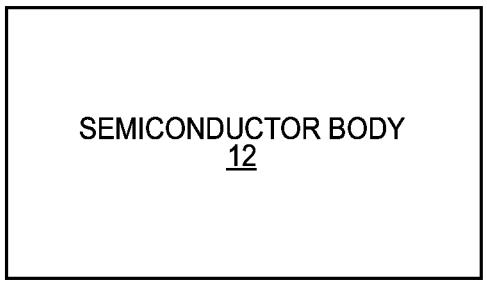
FIGS. 2A through 2C illustrate the conventional process for manufacturing an insulated gate contact described in FIG. 1.
Figure 2B:
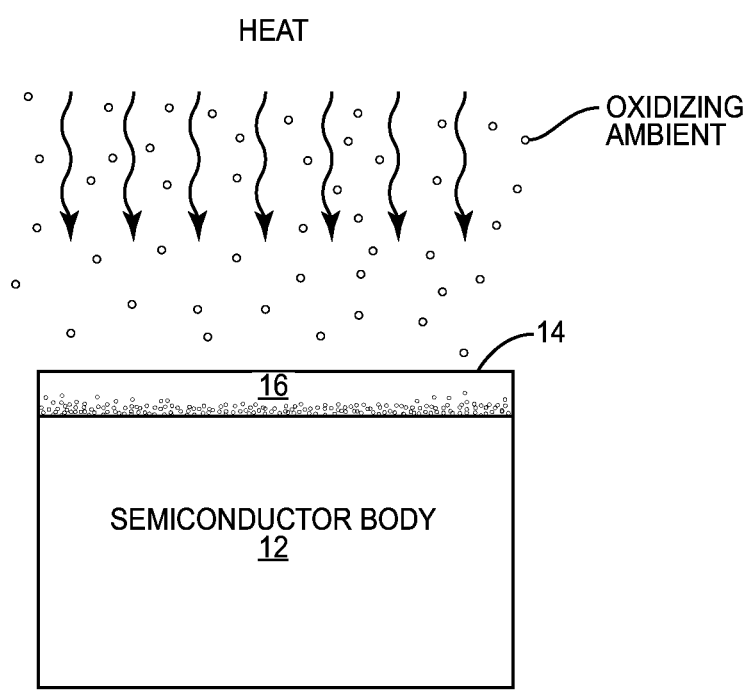
Figure 2C:
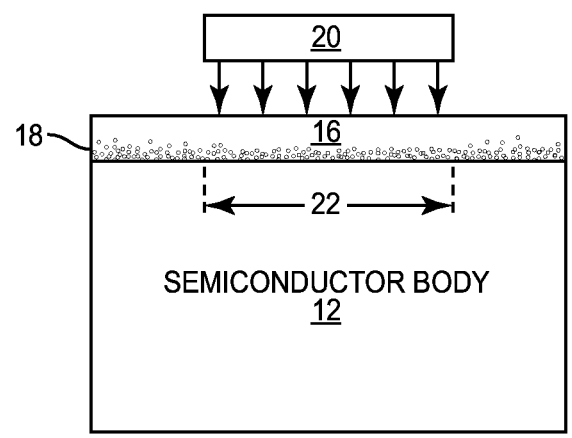
Figure 3:
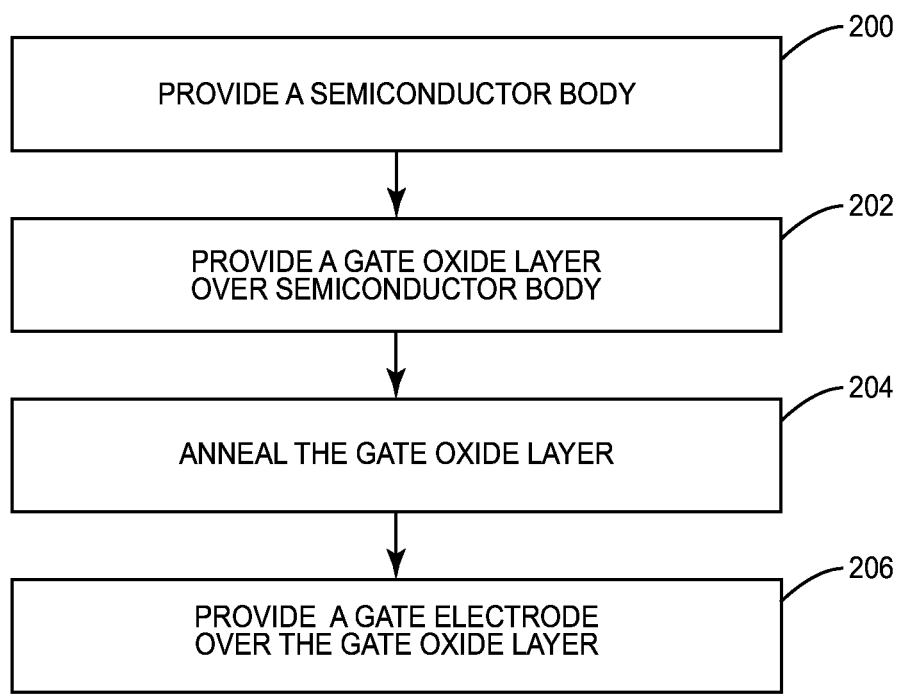
FIG. 3 is a block diagram describing another conventional process for manufacturing an insulated gate contact for a semiconductor device.
Figure 4A:
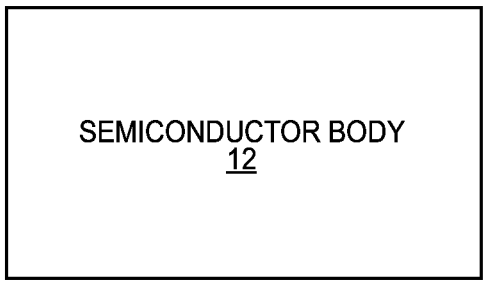
FIGS. 4A through 4D illustrate the conventional process for manufacturing an insulated gate contact described in FIG. 3.
Figure 4B:
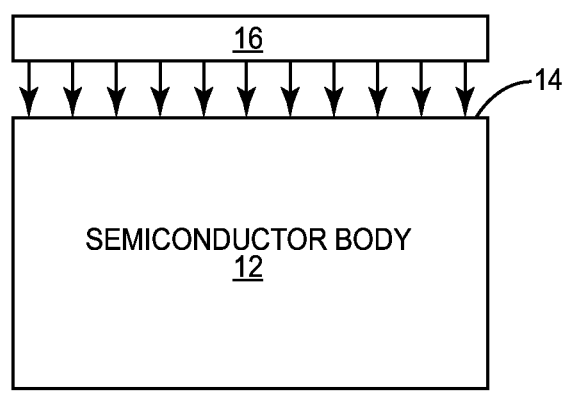
Figure 4C:
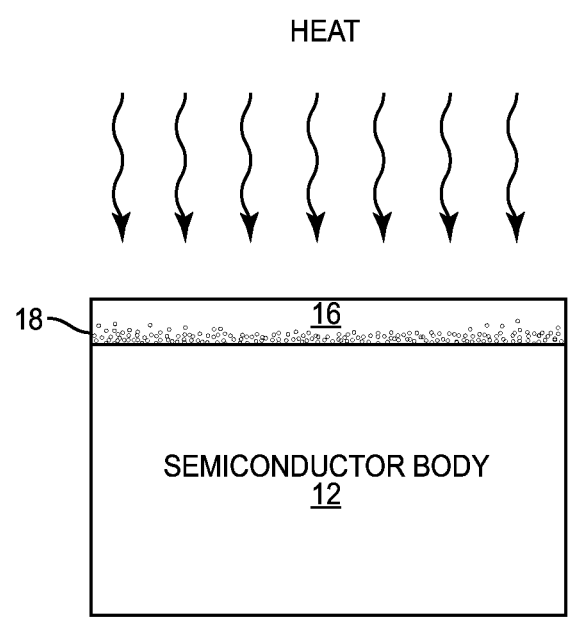
Figure 4D:
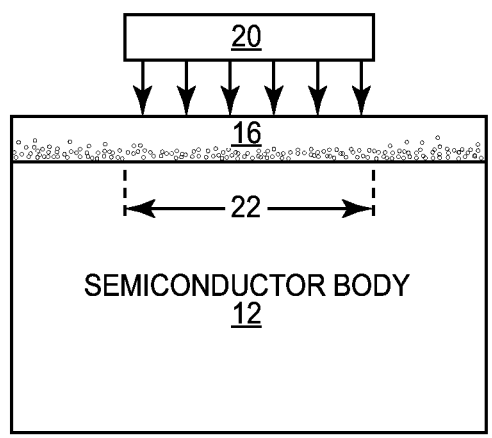
Figure 5:
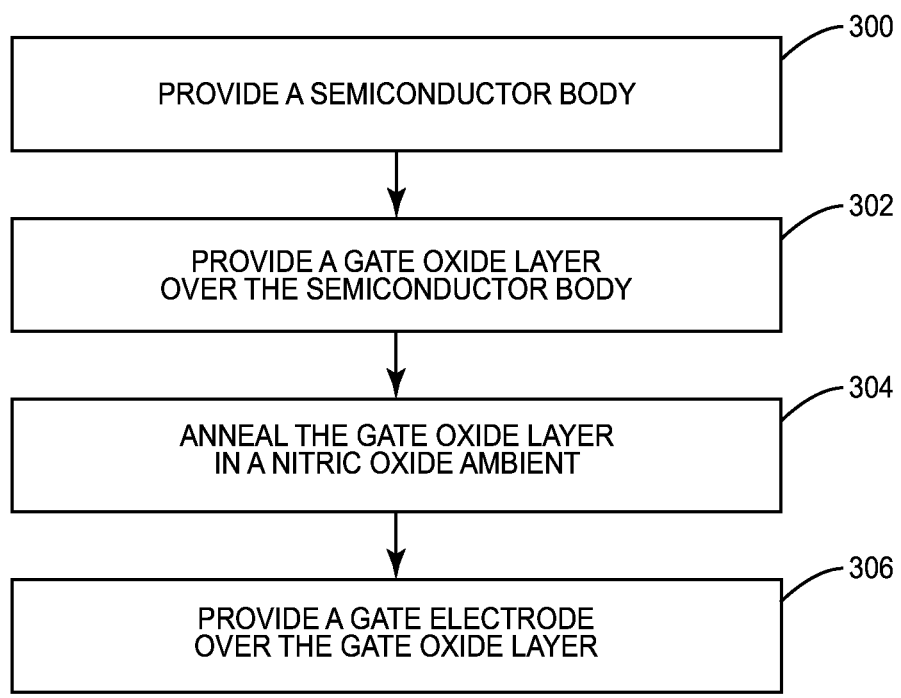
FIG. 5 is a block diagram describing another conventional process for manufacturing an insulated gate contact for a semiconductor device.
Figure 6A:
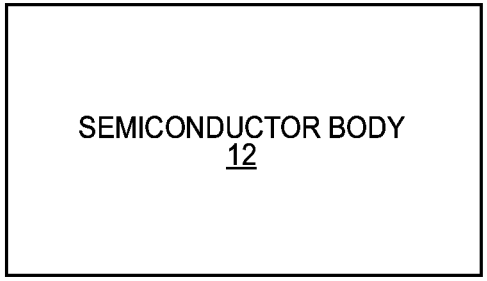
FIGS. 6A through 6D illustrate the conventional process for manufacturing an insulated gate contact described in FIG. 5.
Figure 6B:
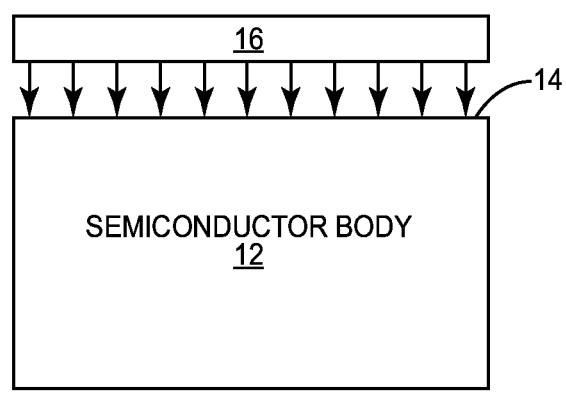
Figure 6C:
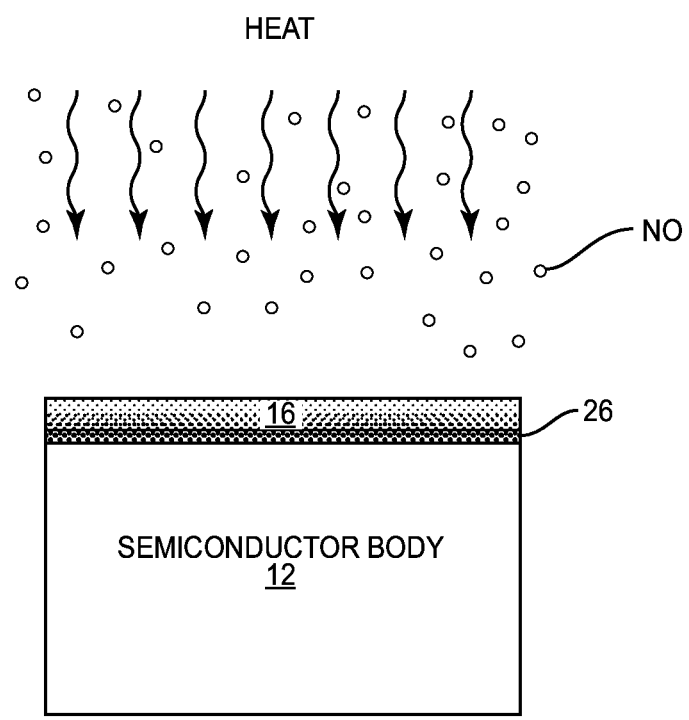
Figure 6D:
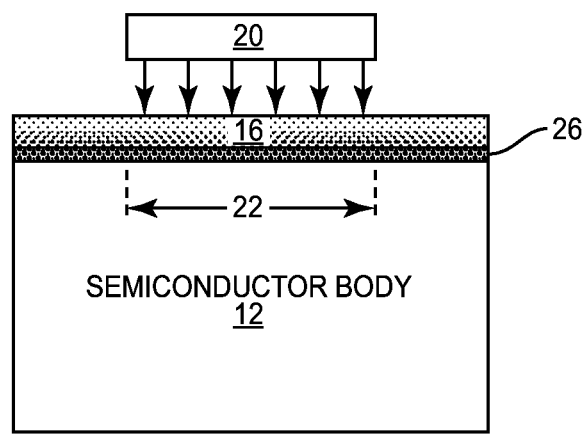

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 7:
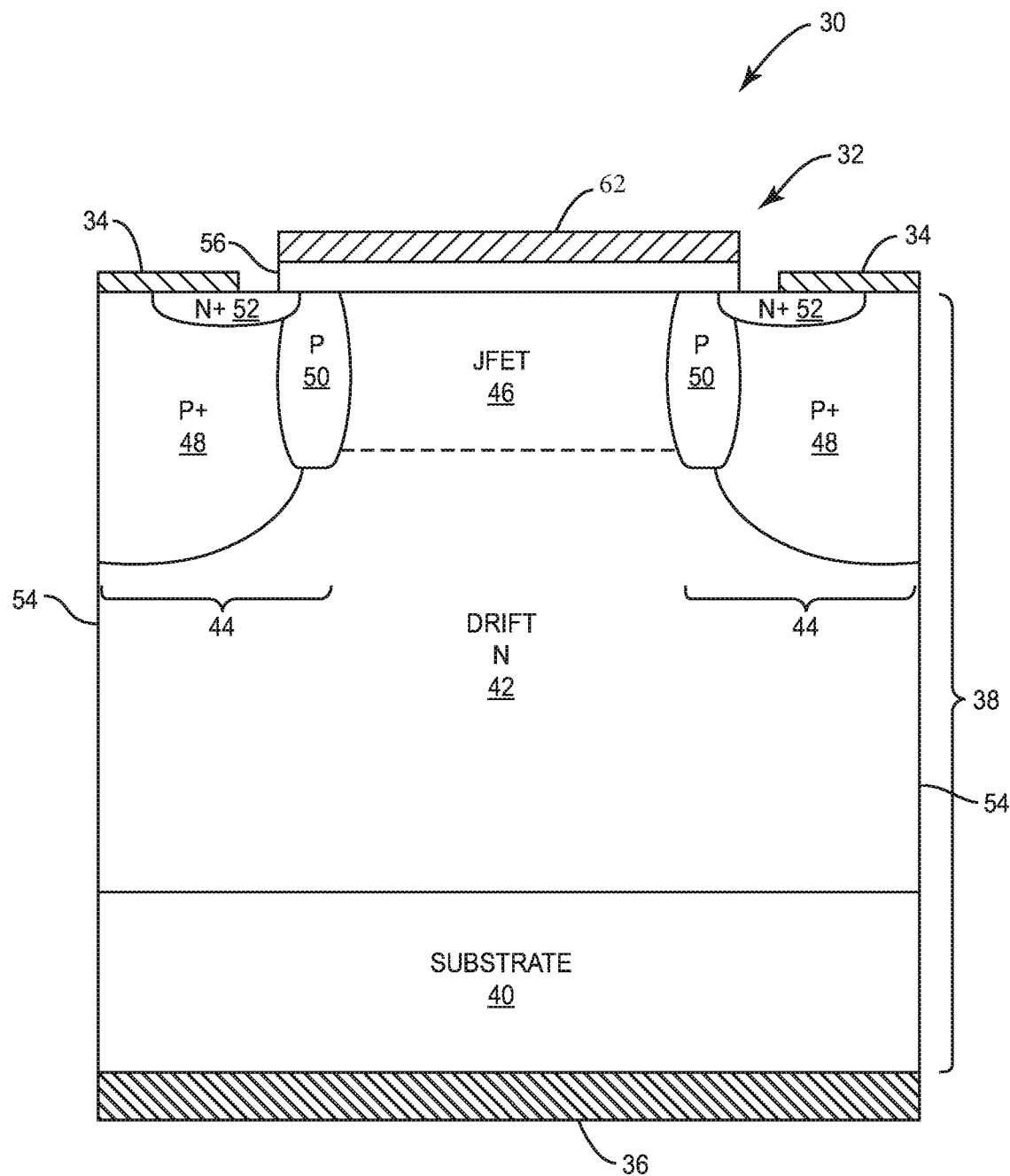
FIG. 7 shows a cross-sectional view of a metal-oxide-semiconductor field-effect transistor including an insulated gate contact according to one embodiment of the present disclosure.

FIG. 7 shows a metal-oxide-semiconductor field-effect transistor (MOSFET) 30 including an insulated gate contact 32 according to one embodiment of the present disclosure. The MOSFET 30 includes the insulated gate contact 32, a source contact 34, a drain contact 36, and a semiconductor body 38. The semiconductor body 38 includes a substrate 40, a drift layer 42 over the substrate 40, one or more junction implants 44 in the surface of the drift layer 42 opposite the substrate 40, and a junction gate field effect transistor (JFET) region 46 between each one of the junction implants 44. Each one of the junction implants 44 is formed by an ion implantation process, and includes a deep well region 48, a base region 50, and a source region 52. Each deep well region 48 extends along a lateral edge 54 of the semiconductor body 38 down towards the substrate 40. The deep well regions 48 may be formed uniformly or include one or more protruding regions. Each base region 50 is formed at the surface of the drift layer 42 opposite the substrate 40, and extends along an inner-edge of one of the deep well regions 48. Each source region 52 is formed at the surface of the drift layer 42 opposite the substrate 40 and extends along a shallow portion of the surface of the drift layer 42 to overlap a portion of the deep well region 48 and the base region 50, without extending over either.

The insulated gate contact 32 includes an enhanced gate insulating layer 56 positioned over an active channel in the MOSFET 30. Specifically, the insulated gate contact 32 is positioned on the surface of the drift layer 42 opposite the substrate 40, and extends laterally between a portion of the surface of each source region 52, such that the enhanced gate insulating layer 56 partially overlaps and runs between the surface of each source region 52 in the junction implants 44. Further, the insulated gate contact 32 includes a gate electrode 62 positioned on top of the enhanced gate insulating layer 56. The source contact 34 is separated into a pair of source contacts 34, each positioned on the surface of the drift region 42 opposite the substrate 40 such that each one of the source contacts 34 partially overlaps both the source region 52 and the deep well region 48 of one of the junction implants 44, and does not contact the insulated gate contact 32. The drain contact 36 is located on the surface of the substrate 40 opposite the drift layer 42.

In operation, when a biasing voltage below the threshold voltage of the device is applied to the insulated gate contact 32, the junction between each deep well region 48 and the drift layer 42 is reverse biased, thereby placing the MOSFET 30 in an OFF state of operation. In the OFF state of operation of the MOSFET 30, any voltage between the source contacts 34 and the drain contact 36 is supported by the drift layer 42, and current does not flow between these contacts. Due to the vertical structure of the MOSFET 30, large voltages may be placed between the source contacts 34 and the drain contact 36 without damaging the device.

When a positive voltage is applied to the drain contact 36 of the MOSFET 30 relative to the source contacts 34 and the voltage placed at the insulated gate contact 32 is above the threshold voltage of the device, an inversion channel layer is formed at the surface of the drift layer 42 within the base regions 50 underneath the insulated gate contact 32, thereby placing the MOSFET 30 in an ON state of operation. Due to the formation of the inversion channel layer in this region, the surface of the drift layer 42 within the base regions 50 underneath the insulated gate contact 32 is referred to as an active channel of the MOSFET 30. In the ON state of operation of the MOSFET 30, current flows from the drain contact 36 to each one of the source contacts 34. An electric field presented by junctions formed between each deep well region 48, each base region 50, and the drift layer 42 constricts current flow in the JFET region 46 into a JFET channel. At a certain spreading distance from the inversion channel layer when the electric field presented by the junction implants 44 is diminished, the flow of current is distributed laterally, or spread out, in the drift layer 42. As discussed briefly above, placing the MOSFET 30 in an ON state of operation relies upon a buildup of charge carriers on the surface of the drift layer 42 below the insulated gate contact 32 to form an inversion channel layer. Conventional insulated gate contacts 32 are often plagued by a concentration of defects at the interface of the insulated gate contact 32 and the drift layer 42, which trap charge carriers and therefore reduce the mobility of the channel. Due to one or more manufacturing processes discussed below and the corresponding structures, the enhanced insulating gate layer 56 overcomes these shortcomings, thereby enhancing the channel mobility of the MOSFET 30.

Finally, when a voltage below the threshold voltage of the MOSFET 30 is placed at the insulated gate contact 32 and a sufficient positive voltage is applied to the source contacts 34 relative to the drain contact 36, the reverse bias of the deep well regions 48 with respect to the drift layer 42 is overcome, and current flows from the source contacts 34 through each one of the deep well regions 48 and into the drift layer 42.

The semiconductor body 38 may be formed from a wide bandgap semiconductor material system, such as silicon carbide (SiC), gallium nitride (GaN), gallium arsenide (GaAs), and the like. As discussed above, due to limitations in the manufacturing of wide bandgap semiconductor devices with insulated gates, a large number of defects may form at the interface of the semiconductor body 38 and a conventional gate oxide layer. Due to the formation of the enhanced gate insulating layer 56, however, the effect of such defects on the channel mobility of the MOSFET 30 are mitigated, as discussed below.

The thicknesses and doping concentrations of the substrate 40, the drift layer 42, the JFET region 46, the deep well regions 48, the base regions 50, and the source regions 52 may vary in different embodiments. Further, the doping types of the various regions of the MOSFET 30 may differ depending on whether the MOSFET 30 is an N-type MOSFET or a P-type MOSFET. In various embodiments, additional layers and/or regions may be included in the semiconductor body 38, all of which are contemplated herein.

While the principles of the present disclosure are primarily discussed above with respect to insulated gate contacts for MOSFETs, the concepts are equally applicable to any insulated contact or contacts for any semiconductor device. In various embodiments, the position of the active channel in the particular semiconductor device and thus that of the insulated contact may vary from that described above (for example, it may be on a trench sidewall for a Trench-gated MOSFET or UMOSFET). Further, the semiconductor body of various devices used according to the present disclosure may include different layers that are functionally distinct from those discussed above. In general, insulated contacts according to the present disclosure are placed on top of a semiconductor body, which may include one or more layers and an active channel. The insulated contact is placed over the active channel in order to modulate one or more characteristics of the channel via a signal provided to the insulated contact.

Figure 8:
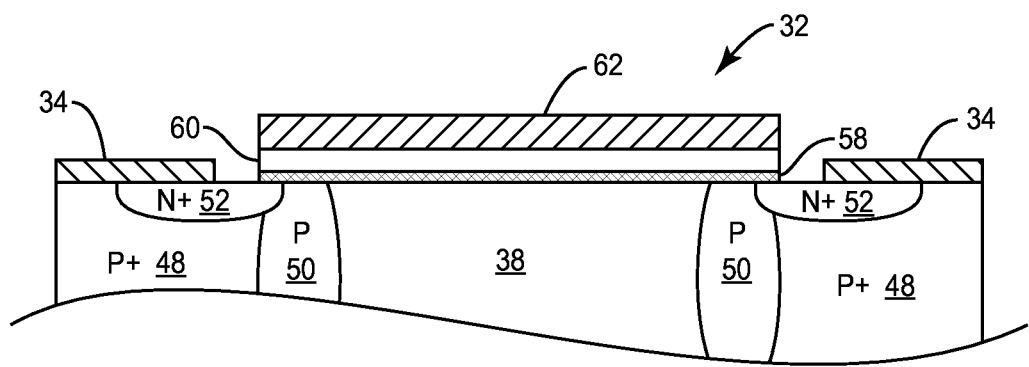
FIG. 8 shows a cross-sectional view of the insulated gate contact shown in FIG. 7 according to one embodiment of the present disclosure.

FIG. 8 shows details of the insulated gate contact 32 according to one embodiment of the present disclosure. The insulated gate contact 32 includes a channel mobility enhancement layer 58, a gate oxide layer 60 over the channel mobility enhancement layer 58, and a gate electrode 62 over the gate oxide layer 60. Notably, due to an improved process for forming the gate oxide layer 60 discussed below, the concentration of byproducts of the channel mobility enhancement layer 58 diffused in the gate oxide layer 60 is minimized, such that the concentration of such byproducts are significantly reduced, leaving a clear demarcation between the gate oxide layer 60 and the channel mobility enhancement layer 58. FIG. 8 shows the result of a manufacturing process in which a diffusion resistant layer (not shown) initially provided between the channel mobility enhancement layer 58 and the gate oxide layer 60 is significantly oxidized such that the diffusion resistant layer becomes part of the gate oxide layer 60, as discussed below. Due to the initially provided diffusion resistant layer, byproducts of the channel mobility enhancement layer 58 are not diffused into the gate oxide layer 60. Accordingly, the reliability, power handling capabilities, and leakage current of the MOSFET 30 are preserved, while simultaneously improving the channel mobility of the device via the channel mobility enhancement layer 58. The channel mobility enhancement layer 58 prevents charge carriers from being trapped at the interface between the gate oxide layer 60 and the drift layer 42, thereby offsetting the negative effects of any defects present in the gate oxide layer 60 due to manufacturing limitations in the creation and/or annealing of the gate oxide layer 60.

Figure 9:
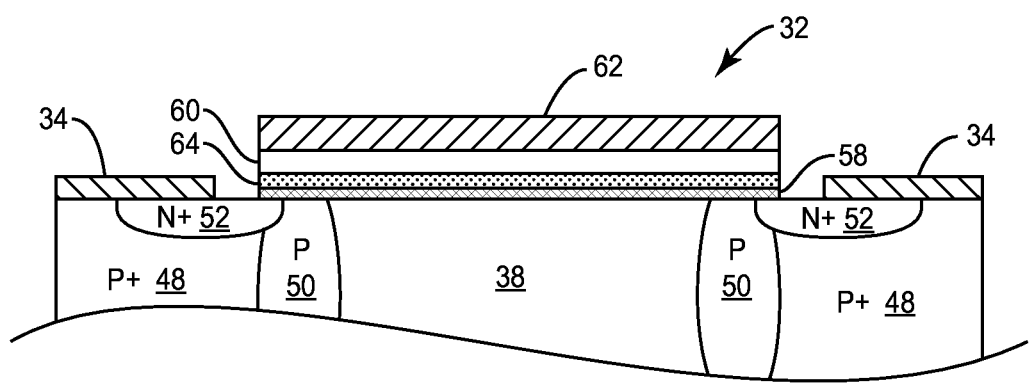
FIG. 9 shows a cross-sectional view of the insulated gate contact shown in FIG. 7 according to an additional embodiment of the present disclosure.

FIG. 9 shows details of the insulated gate contact 32 according to an additional embodiment of the present disclosure. The insulated gate contact 32 includes the channel mobility enhancement layer 58, a diffusion barrier layer 64 over the channel mobility enhancement layer 58, the gate oxide layer 60 over the diffusion barrier layer 64, and the gate electrode 62 over the gate oxide layer 60. The diffusion barrier layer 64 prevents diffusion of byproducts from the channel mobility enhancement layer 58 into the gate oxide layer 60, thereby preserving the reliability, power handling capabilities, and leakage current of the MOSFET 30 while simultaneously improving the channel mobility of the device via the channel mobility enhancement layer 58. Unlike the diffusion resistant layer discussed above which is oxidized to become part of a gate oxide layer, the diffusion barrier layer 64 remains intact in the insulated gate contact 32.

Figure 10:
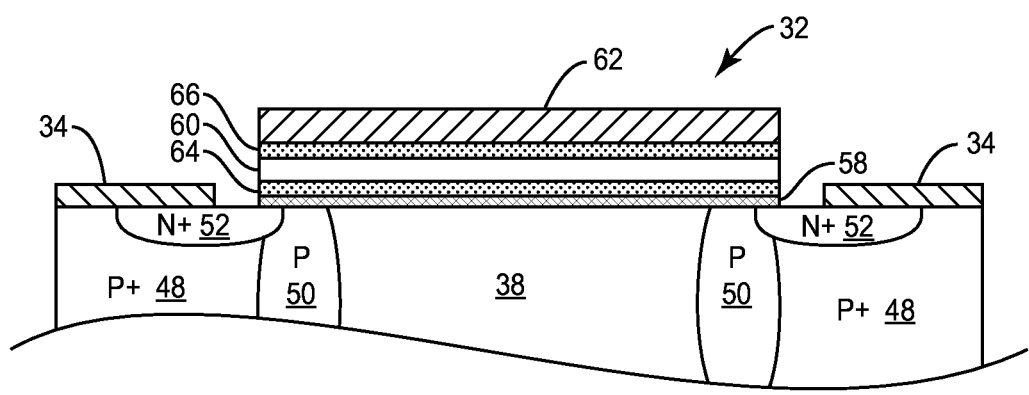
FIG. 10 shows a cross-sectional view of the insulated gate contact shown in FIG. 7 according to an additional embodiment of the present disclosure.

FIG. 10 shows details of the insulated gate contact 32 according to another embodiment of the present disclosure. The insulated gate contact 32 shown in FIG. 10 is substantially similar to that shown in FIG. 9, but further includes an additional diffusion barrier layer 66 between the gate oxide layer 60 and the gate electrode 62. The additional diffusion barrier layer 66 prevents diffusion of byproducts from the gate electrode 62 into the gate oxide layer 60, thereby further preserving the reliability, power handling capabilities, and leakage current of the MOSFET 30.

Figure 11:
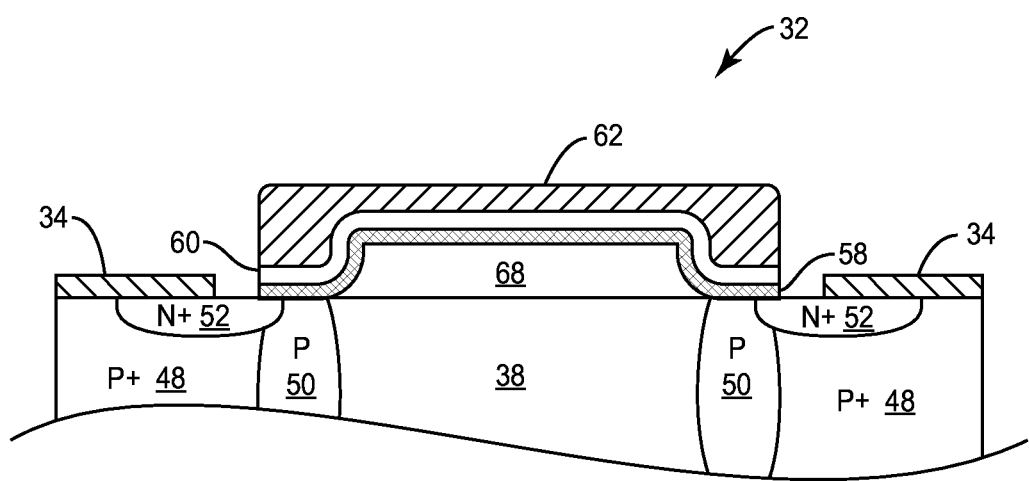
FIG. 11 shows a cross-sectional view of the insulated gate contact shown in FIG. 7 according to an additional embodiment of the present disclosure.
Figure 12:
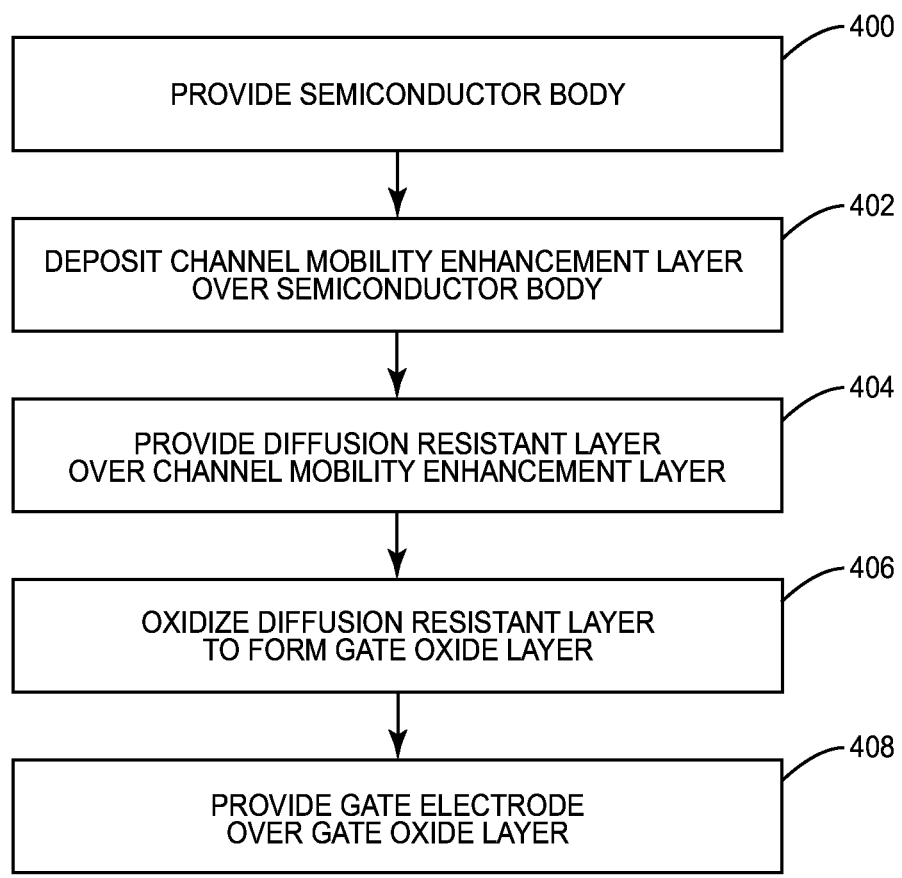
FIG. 12 is a block diagram describing a process for manufacturing an insulated gate contact for a semiconductor device according to one embodiment of the present disclosure.

In some embodiments, it may be desirable to limit the contact between the insulated gate contact 32 and the semiconductor body 38 to those areas that are directly over an active channel in the MOSFET 30. This may be due to, for example, an increase in leakage current that may occur due to contact between the enhanced insulating gate layer 56 and a bulk of the semiconductor body 38. Accordingly, FIG. 11 shows details of the insulated gate contact 32 according to yet another embodiment of the present disclosure. The insulated gate contact 32 shown in FIG. 11 is substantially similar to that shown in FIG. 8, but further includes a bulk offset region 68 between the semiconductor body 38 and the channel mobility enhancement layer 58. The bulk offset region 68 is provided over the portion of the semiconductor body 38 in which a channel is not present, for example, between each one of the base regions 50 on the surface of the drift layer 42 opposite the substrate 40. The channel mobility enhancement layer 58 and the gate electrode 62 are provided over the bulk offset region 68 and the exposed portions of the semiconductor body 38, such that the channel mobility enhancement layer 58 only contacts the portions of the semiconductor body 38 over which a channel, such as the channel between each base region 50 and source region 52 in each one of the junction implants 44 exists. The bulk offset region 68 may be also used with the insulated gate contact 32 shown in FIGS. 9 and 10.

The channel mobility enhancement layer 58 may be one or more of potassium (K), rubidium (Rb), cesium (Cs), strontium (Sr), barium (Ba), lanthanum (La), scandium (Sc), phosphorus (P), arsenic (As), antimony (Sb), bismuth (Bi), vanadium (V), niobium (Nb), and tantalum (Ta). Further, the channel mobility enhancement layer may be between about 0.1 nm and 5 nm thick. The gate oxide layer 60 may be silicon oxide ($Si_xO_y$), aluminum oxide ($Al_xO_y$), magnesium oxide ($Mg_xO_y$), a mixture of these, or any other suitable dielectric material or mixture. Further, the gate oxide layer 60 may be between about 10 nm and 100 nm thick. The gate electrode 62 may be one or more of a metal layer, a poly-silicon layer, or any other suitable conductive material. Further, the gate electrode 62 may be between 10 nm and 1000 nm thick. The diffusion resistant layer may be one or more of silicon nitride ($Si_xN_y$), silicon-oxy-nitride ($SiO_xN_y$), silicon oxy-nitro-carbide ($SiO_xN_yC_z$), aluminum oxide ($Al_xO_y$), magnesium oxide ($Mg_xO_y$), mixtures of these, or the like. In general, the diffusion resistant layer may be any material configured to prevent diffusion of byproducts from the channel mobility enhancement layer 58 into the gate oxide layer 60 while partially or totally converting into a dielectric material such as silicon dioxide ($SiO_2$) in an oxidation or annealing process, as discussed below. The diffusion barrier layer 64 may be the same or a different material from that of the diffusion resistant layer. Generally, the diffusion barrier layer 64 is not oxidized to become part of the gate oxide layer 60, but rather remains intact in the finished insulated gate contact 32. However, the diffusion barrier layer 64 may similarly be oxidized to become part of the gate oxide layer 60 without departing from the principles of the present disclosure. The diffusion barrier layer 64 may be between 0.1 nm and 100 nm thick.

Similar to the diffusion resistant layer and the diffusion barrier layer 64, the additional diffusion barrier layer 66 may also be one or more of silicon nitride ($Si_3N_4$), silicon-oxy-nitride ($SiO_xN_y$), silicon oxy-nitro-carbide ($SiO_xN_yC_z$), or the like. In one embodiment, the additional diffusion barrier layer 66 may be any material configured to prevent diffusion of byproducts from the gate electrode 62 into the gate oxide layer 60 while partially or totally converting into a dielectric material such as silicon dioxide ($SiO_2$) in an oxidation or annealing process, as discussed below. Further, the additional diffusion barrier layer 66 may be between 0.1 nm and 100 nm thick. In general, the diffusion barrier layer 64 and the additional diffusion barrier layer 66 are materials that are chemically compatible with the channel mobility enhancement layer 58, the gate oxide layer 60, and the gate electrode 62, are wide bandgap (e.g., between 6 and 9 eV) with a proper electron affinity to symmetrically align to the material system of the semiconductor body 38, and have a relative dielectric constant greater than or equal to that of silicon dioxide ($SiO_2$).

FIGS. 12 and 13A-13E illustrate a process for forming the insulated gate contact 32 according to one embodiment of the present disclosure. Generally, the insulated gate contact 32 is formed after the deep well regions 48, the base regions 50, and the source regions 52, and therefore these regions are also shown for context. First, the wide bandgap semiconductor body 38 is provided (step 400 and FIG. 13A). The channel mobility enhancement layer 58 is then deposited on a surface of the semiconductor body 38 (step 402 and FIG. 13B). Specifically, the channel mobility enhancement layer 58 is placed on a surface of the semiconductor body 38 over a channel, such as over the channel formed between the base region 50 and the source region 52 on the surface of the drift layer 42 opposite the substrate 40. In some embodiments, the channel mobility enhancement layer 58 and the resulting insulated gate contact 32 are provided only over the active channel(s) in the MOSFET 30 by using the bulk offset region 68 discussed above. The channel mobility enhancement layer 58 may be deposited via chemical vapor deposition, evaporation, sputtering, or the like. Further, the channel mobility enhancement layer 58 may be deposited on all or a portion of the surface of the semiconductor body 38. For example, depositing the channel mobility enhancement layer 58 may include providing a mask (not shown) on the surface of the semiconductor body 38, depositing the channel mobility enhancement layer 58, and subsequently removing the mask (not shown) in some embodiments.

Figure 13A:
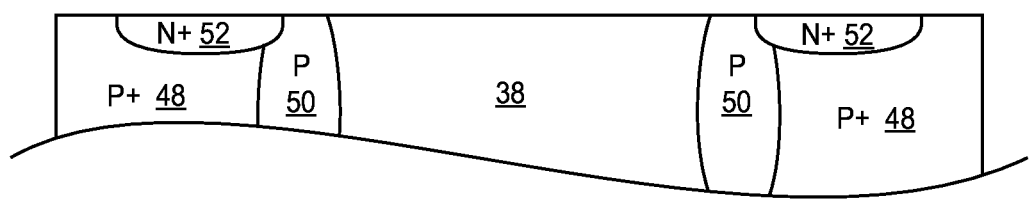
FIGS. 13A through 13E illustrate the process for manufacturing an insulated gate contact described in FIG. 12.
Figure 13B:
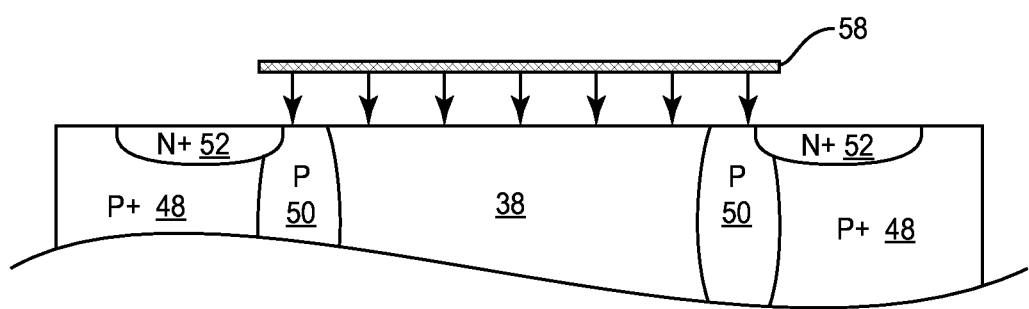
Figure 13C:
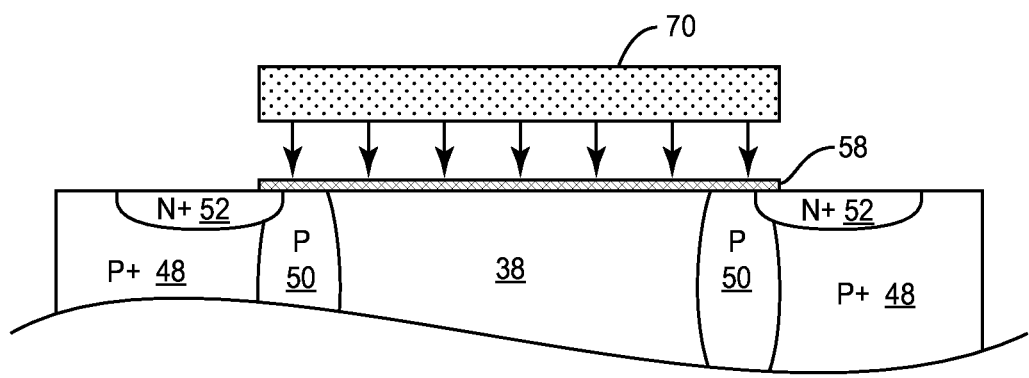

A diffusion-resistant layer 70 is then provided over the channel mobility enhancement layer 58 (step 404 and FIG. 13C). The diffusion-resistant layer 70 may be deposited, for example, via chemical vapor deposition, evaporation, sputtering, or the like, or may be grown via an epitaxial process. Further, the diffusion-resistant layer 70 may be deposited on all or a portion of the channel mobility enhancement layer 58 and the surface of the semiconductor body 38. For example, depositing the diffusion-resistant layer 70 may include providing a mask (not shown) over the channel mobility enhancement layer 58 and any exposed portions of the surface of the semiconductor body 38, providing the diffusion-resistant layer 70, and subsequently removing the mask (not shown) in some embodiments. Further, the mask (not shown) used to deposit the channel mobility enhancement layer 58 may also be re-used to selectively provide the diffusion-resistant layer 70 in some embodiments. The diffusion-resistant layer 70 may be poly-silicon, which is denser than many dielectric materials and therefore resistant to diffusion of byproducts from the channel mobility enhancement layer 58. Accordingly, the diffusion-resistant layer 70 prevents degradation of the resulting gate oxide layer as discussed below.

Figure 13D:
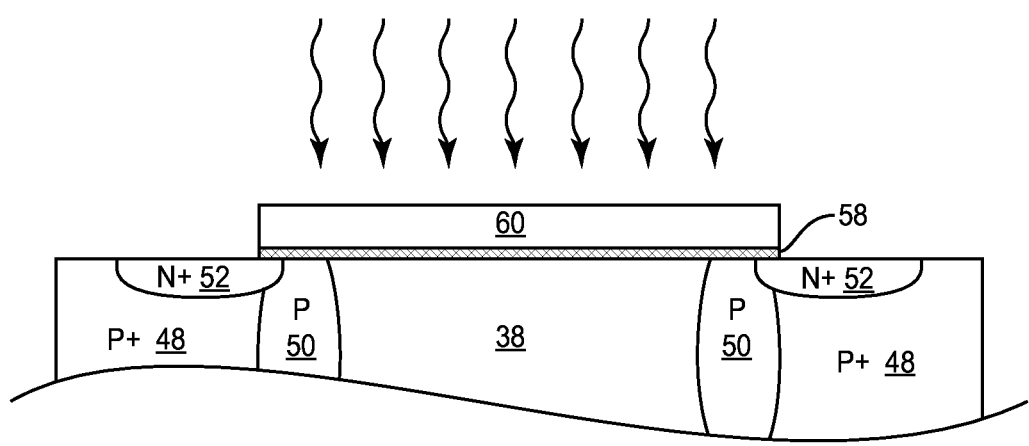
Figure 13E:
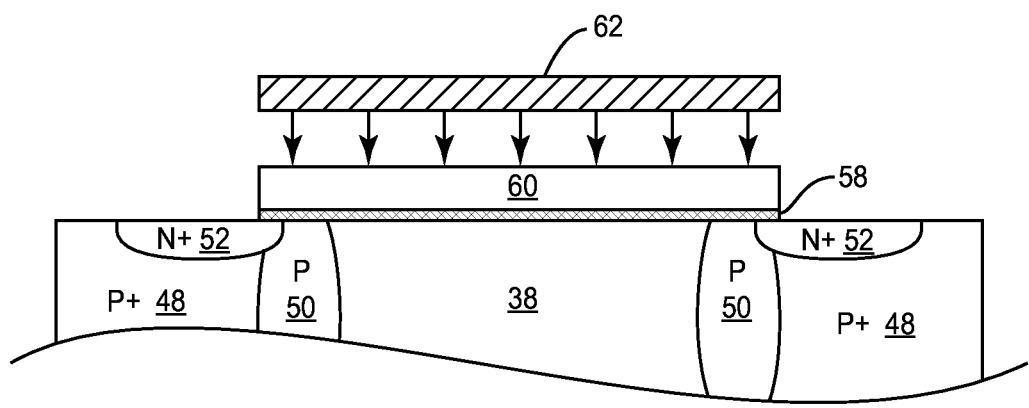
Figure 14:
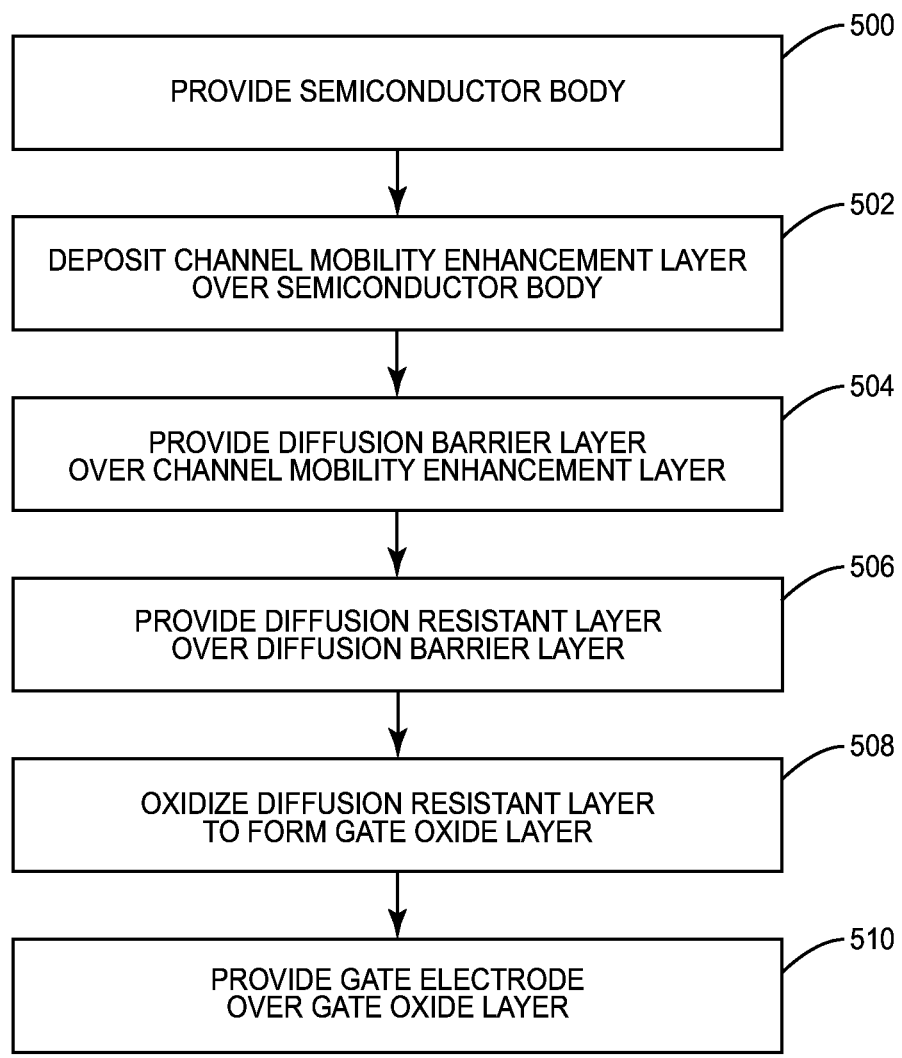
FIG. 14 is a block diagram describing a process for manufacturing an insulated gate contact for a semiconductor device according to one embodiment of the present disclosure.

The diffusion-resistant layer 70 is then oxidized to generate the gate oxide layer 60 (step 406 and FIG. 13D). In one embodiment, oxidizing the diffusion-resistant layer 70 includes exposing the diffusion-resistant layer 70 and the semiconductor body 38 to heat (represented by the wavy lines shown in FIG. 13D) in an oxidizing ambient (represented by the dots in FIG. 13D). When poly-silicon is oxidized, silicon dioxide ($SiO_2$) is formed, which is the desired dielectric for forming the gate oxide layer 60. Generally, oxidation of the diffusion-resistant layer 70 will occur from the top-down. While the diffusion-resistant layer

70 is resistant to diffusion of byproducts from the channel mobility enhancement layer 58, the resulting gate oxide layer 60 is not. Accordingly, oxidation of the diffusion-resistant layer 70 may be precisely controlled in order to oxidize as much of the diffusion-resistant layer 70 into the gate oxide layer 60 as possible, while simultaneously preventing the diffusion of byproducts from the channel mobility enhancement layer 58 into the gate oxide layer 60. The result is a channel mobility enhancement layer 58 for increasing the channel mobility of the resulting semiconductor device and the gate oxide layer 60 free from diffused byproducts from the channel mobility enhancement layer 58 for maintaining the reliability, power handling capability, and leakage current of the device. Finally, the gate electrode 62 is provided over the gate oxide layer 60 (step 408 and FIG. 13E). The gate electrode 62 may be provided by any suitable deposition or growth process without departing from the principles described herein.

FIGS. 14 and 15A-15F illustrate a process for forming the insulated gate contact 32 according to an additional embodiment of the present disclosure. First, the wide bandgap semiconductor body 38 is provided (step 500 and FIG. 15A). The channel mobility enhancement layer 58 is then deposited on a surface of the semiconductor body 38 (step 502 and FIG. 15B). As discussed above, the channel mobility enhancement layer 58 is placed on a surface of the semiconductor body 38 over an active channel in the device, such as over the active channel formed between the base region 50 and the source region 52 on the surface of the drift layer 42 opposite the substrate 40. In some embodiments, the channel mobility enhancement layer 58 and the resulting insulated gate contact 32 are provided only over the active channel(s) in the MOSFET 30 by using the bulk offset region 68 discussed above. The channel mobility enhancement layer 58 may be deposited via chemical vapor deposition, evaporation, sputtering, or the like. Further, the channel mobility enhancement layer 58 may be deposited on all or a portion of the surface of the semiconductor body 38. For example, depositing the channel mobility enhancement layer 58 may include providing a mask (not shown) on the surface of the semiconductor body 38, depositing the channel mobility enhancement layer 58, and subsequently removing the mask (not shown) in some embodiments.

Figure 15A:
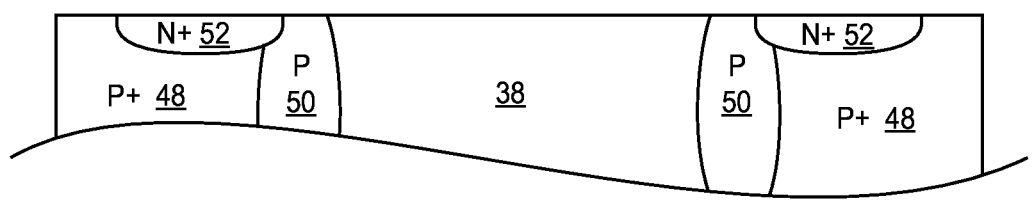
FIGS. 15A through 15F illustrate the process for manufacturing an insulated gate contact described in FIG. 14.
Figure 15B:
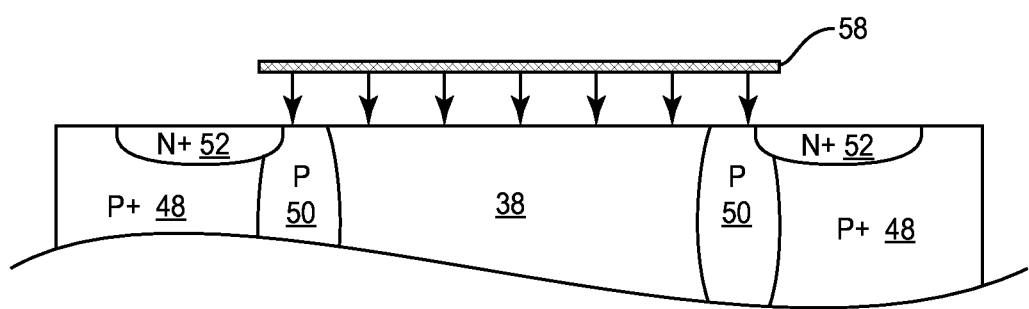
Figure 15C:
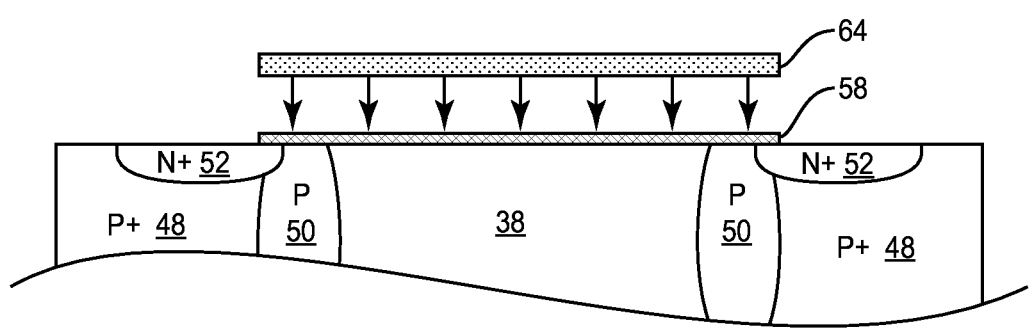

The diffusion barrier layer 64 is then provided over the channel mobility enhancement layer 58 (step 504 and FIG. 15C). The diffusion barrier layer 64 may be deposited, for example, via chemical vapor deposition, evaporation, sputtering, or the like, or may be grown via an epitaxial process. Further, the diffusion barrier layer 64 may be deposited on all or a portion of the channel mobility enhancement layer 58 and the surface of the semiconductor body 38. For example, depositing the diffusion barrier layer 64 may include providing a mask (not shown) over the channel mobility enhancement layer 58 and any exposed portions of the surface of the semiconductor body 38, providing the diffusion barrier layer 64, and subsequently removing the mask (not shown) in some embodiments. Further, the mask (not shown) used to deposit the channel mobility enhancement layer 58 may be re-used to selectively provide the diffusion barrier layer 64 in some embodiments.

Figure 15D:
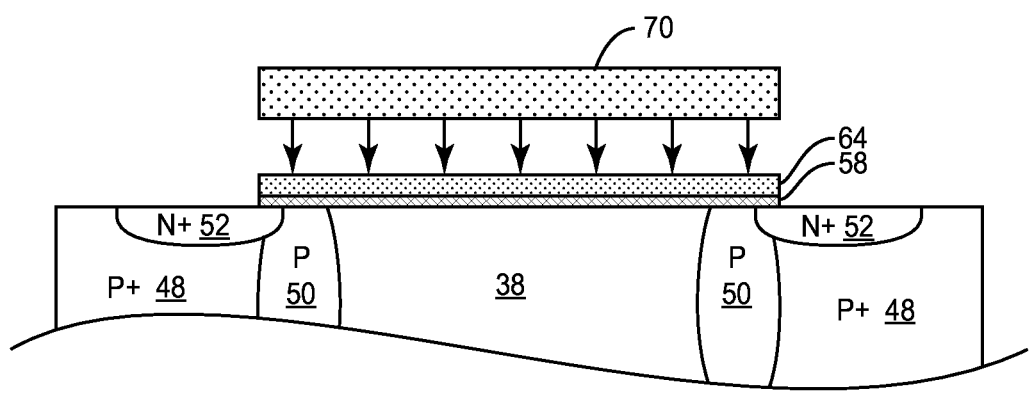

Next, the diffusion-resistant layer 70 is provided over the diffusion barrier layer 64 (step 506 and FIG. 15D). As discussed above, the diffusion-resistant layer 70 may be deposited, for example, via chemical vapor deposition, evaporation, sputtering, or the like; or may be grown via an epitaxial process. Further, the diffusion-resistant layer 70 may be provided on all or a portion of the diffusion barrier layer 64 and the surface of the semiconductor body 38. For example, depositing the diffusion-resistant layer 70 may include providing a mask (not shown) over the diffusion barrier layer 64 and any exposed portions of the surface of the semiconductor body 38, providing the diffusion-resistant layer 70, and subsequently removing the mask (not shown) in some embodiments. Further, the mask (not shown) used to deposit the diffusion barrier layer 64 and the channel mobility enhancement layer 58 may also be re-used to selectively provide the diffusion-resistant layer 70 in some embodiments.

Figure 15E:
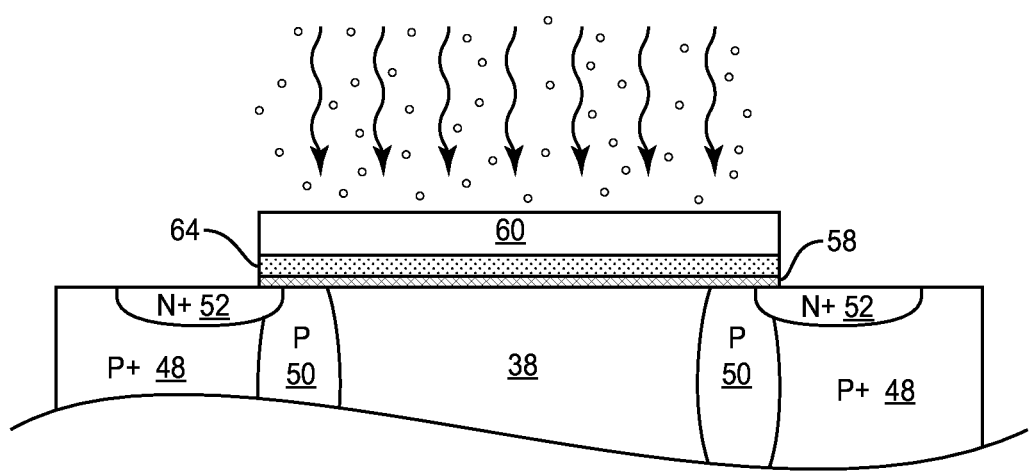
Figure 15F:
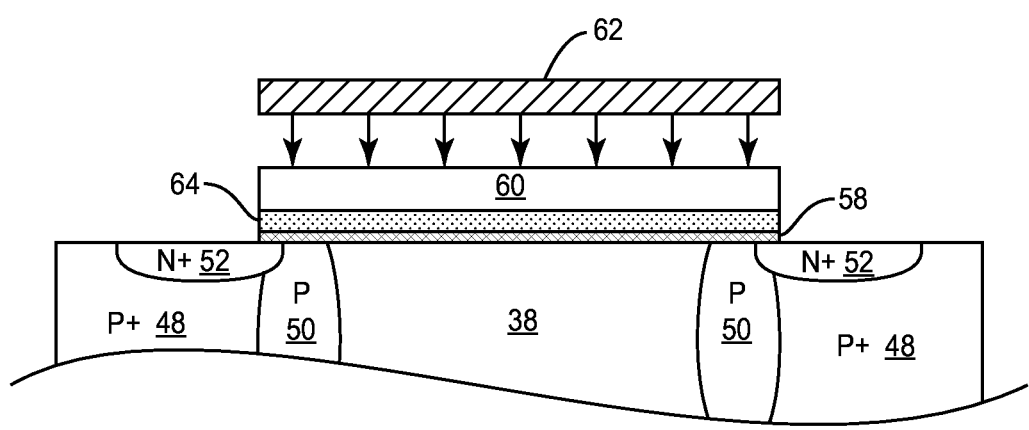
Figure 16:
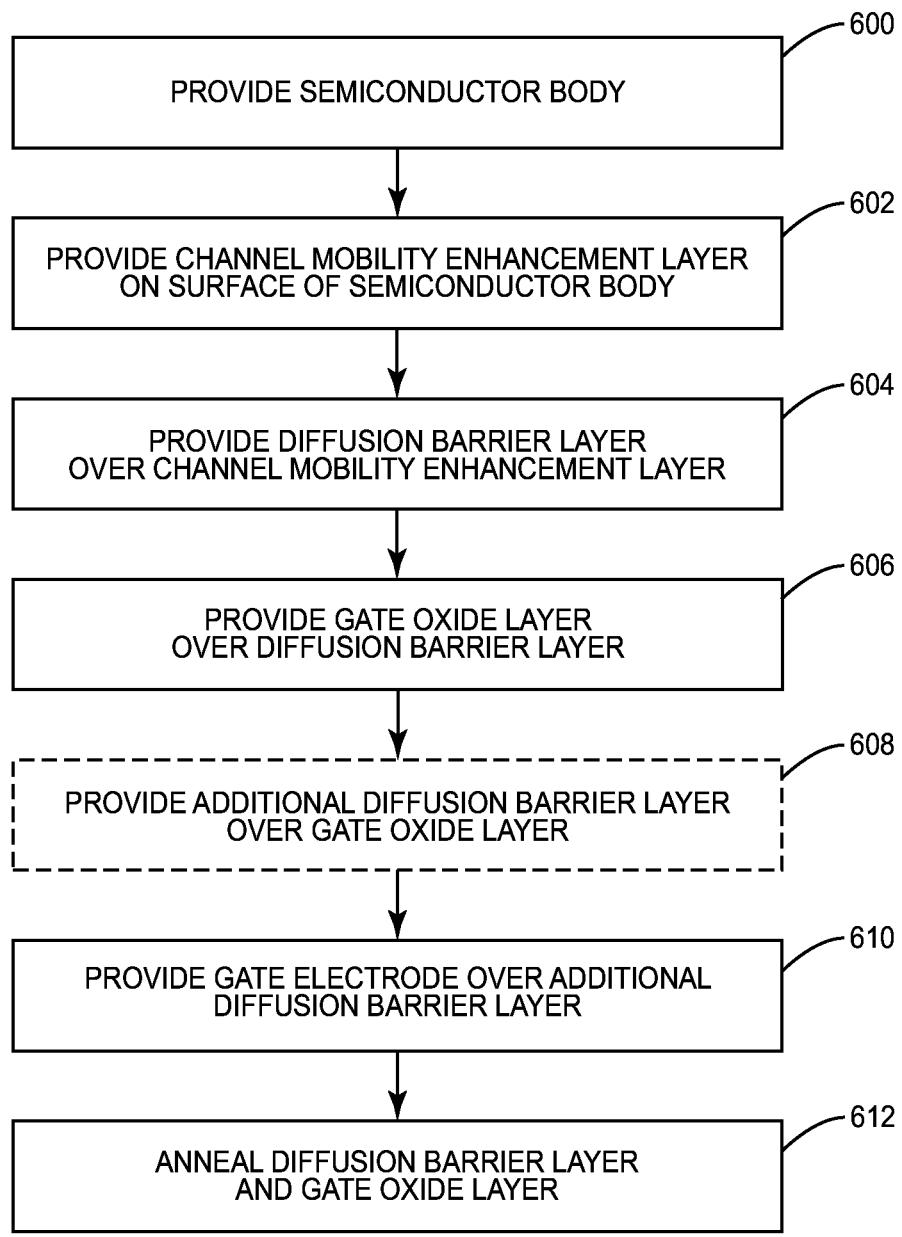
FIG. 16 is a block diagram describing a process for manufacturing an insulated gate contact for a semiconductor device according to one embodiment of the present disclosure.

The diffusion-resistant layer 70 is then oxidized to generate the gate oxide layer 60 (step 508 and FIG. 15E). As discussed above, oxidizing the diffusion-resistant layer 70 may include exposing the diffusion-resistant layer 70 and the semiconductor body 38 to heat (represented by the wavy lines shown in FIG. 15E) in an oxidizing ambient (represented by the dots in FIG. 15E). When poly-silicon is oxidized, silicon dioxide ($SiO_2$) is formed, which is the desired dielectric for forming the gate oxide layer 60. Generally, oxidation of the diffusion-resistant layer 70 will occur from the top-down. Accordingly, oxidation of the diffusion-resistant layer 70 may be precisely controlled in order to oxidize as much of the diffusion-resistant layer 70 into the gate oxide layer 60 as possible without oxidizing the diffusion barrier layer 64. In other embodiments, oxidation of the diffusion-resistant layer 70 may include oxidizing as much of the diffusion-resistant layer 70 and the diffusion barrier layer 64 as possible without diffusing byproducts from the channel mobility enhancement layer 58 into the resulting gate oxide layer 60. The result is a channel mobility enhancement layer 58 for increasing the channel mobility of the resulting semiconductor device and a gate oxide layer 60 free from diffused byproducts from the channel mobility enhancement layer 58 for maintaining the reliability, power handling capability, and leakage current of the device. Finally, the gate electrode 62 is provided over the gate oxide layer 60 (step 510 and FIG. 15F). The gate electrode 62 may be provided by any suitable deposition or growth process without departing from the principles described herein.

FIGS. 16 and 17A-17G illustrate a process for forming the insulated gate contact 32 according to yet another embodiment of the present disclosure. First, the wide bandgap semiconductor body 38 is provided (step 600 and FIG. 17A). The channel mobility enhancement layer 58 is then deposited on a surface of the semiconductor body 38 (step 602 and FIG. 17B). As discussed above, the channel mobility enhancement layer 58 is placed on a surface of the semiconductor body 38 over a channel, such as over the channel formed between the base region 50 and the source region 52 on the surface of the drift layer 42 opposite the substrate 40. In some embodiments, the channel mobility enhancement layer 58 and the resulting insulated gate contact 32 are provided only over the active channel(s) in the MOSFET 30 by using the bulk offset region 68 discussed above. The channel mobility enhancement layer 58 may be deposited via chemical vapor deposition, evaporation, sputtering, or the like. Further, the channel mobility enhancement layer 58 may be deposited on all or a portion of the surface of the semiconductor body 38. For example, depositing the channel mobility enhancement layer 58 may include providing a mask (not shown) on the surface of the semiconductor body 38, depositing the channel mobility enhancement layer 58, and subsequently removing the mask (not shown) in some embodiments.

The diffusion barrier layer 64 is then provided over the channel mobility enhancement layer 58 (step 604 and FIG.

17C). The diffusion barrier layer 64 may be deposited, for example, via chemical vapor deposition, evaporation, sputtering, or the like, or may be grown via an epitaxial process. Further, the diffusion barrier layer 64 may be deposited on all or a portion of the channel mobility enhancement layer 58 and the surface of the semiconductor body 38. For example, depositing the diffusion barrier layer 64 may include providing a mask (not shown) over the channel mobility enhancement layer 58 and any exposed portions of the surface of the semiconductor body 38, providing the diffusion barrier layer 64, and subsequently removing the mask (not shown) in some embodiments. Further, the mask (not shown) used to deposit the channel mobility enhancement layer 58 may be re-used to selectively provide the diffusion barrier layer 64 in some embodiments.

Figure 17A:
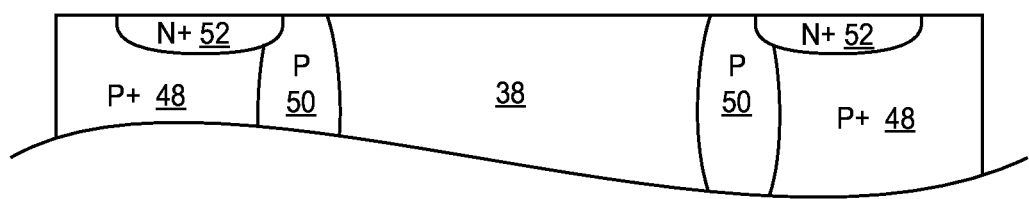
FIGS. 17A through 17G illustrate the process for manufacturing an insulated gate contact described in FIG. 16.
Figure 17B:
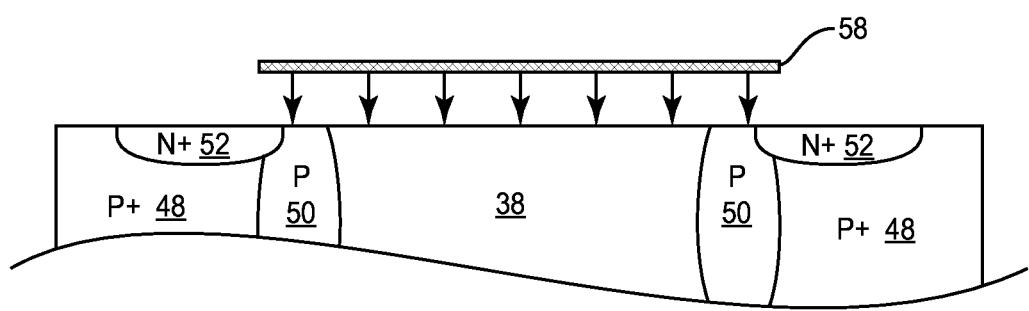
Figure 17C:
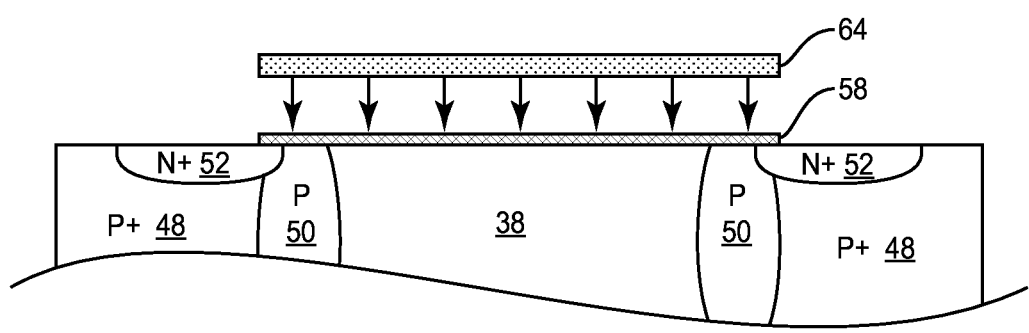
Figure 17D:
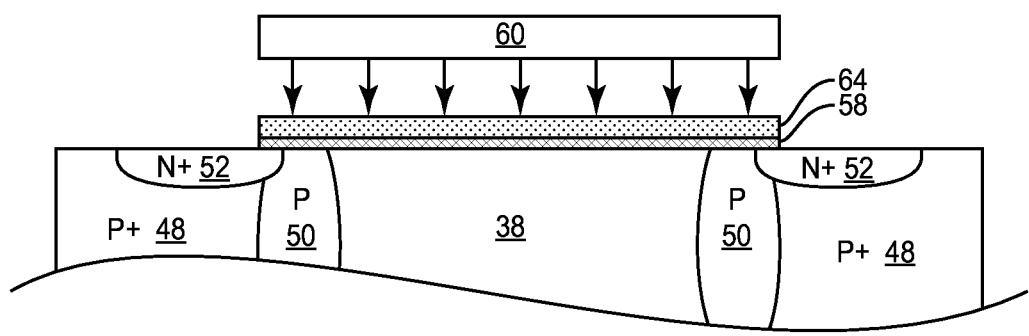

The gate oxide layer 60 is then provided over the diffusion barrier layer 64 (step 606 and FIG. 17D). The gate oxide layer 60 may be provided by any suitable deposition or growth process. Further, the gate oxide layer 60 may be deposited on all or a portion of the diffusion barrier layer 64 and the surface of the semiconductor body 38. For example, depositing the gate oxide layer 60 may include providing a mask (not shown) over the diffusion barrier layer 64 and any exposed portions of the surface of the semiconductor body 38, providing the gate oxide layer 60, and subsequently removing the mask (not shown) in some embodiments. Further, the mask (not shown) used to deposit the diffusion barrier layer 64 and the channel mobility enhancement layer 58 may be re-used to selectively provide the gate oxide layer 60 in some embodiments.

Figure 17E:
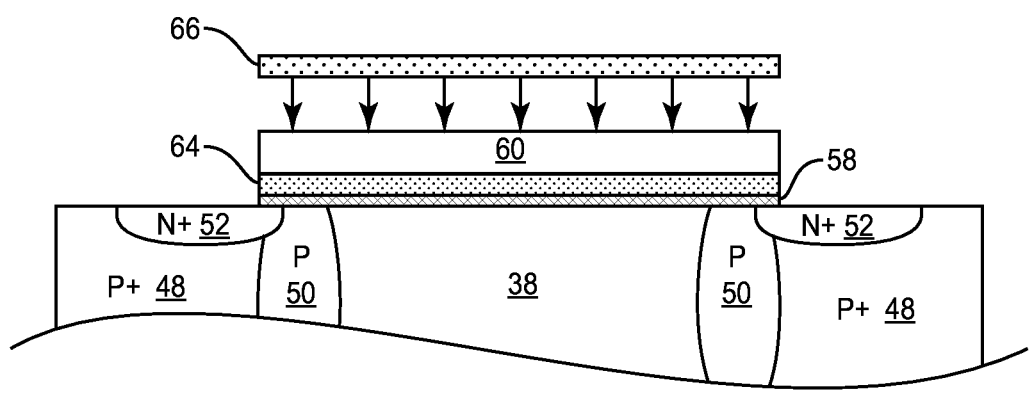
Figure 17F:
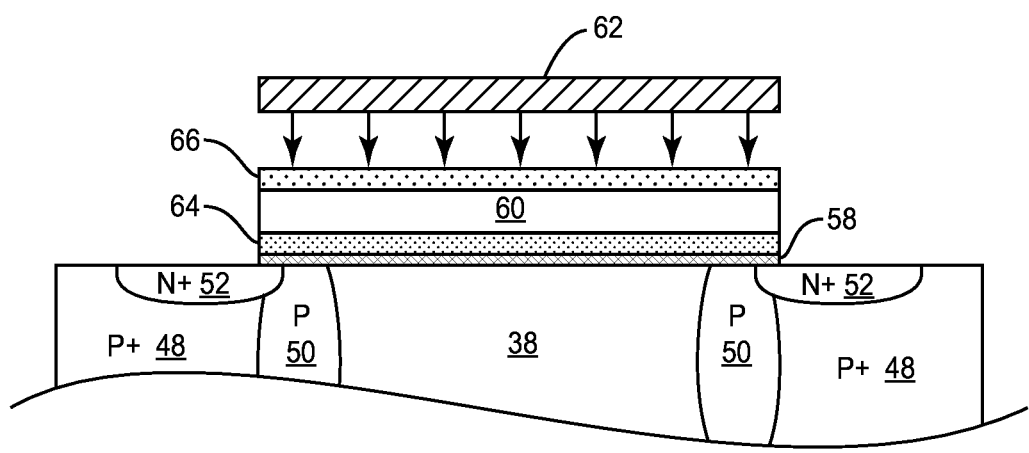

The additional diffusion barrier layer 66 is then optionally provided over the gate oxide layer 60 (step 608 and FIG. 17E). The additional diffusion barrier layer 66 may be deposited, for example, via chemical vapor deposition, evaporation, sputtering, or the like; or may be grown via an epitaxial process. Further, the additional diffusion barrier layer 66 may be provided on all or a portion of the gate oxide layer 60 and the surface of the semiconductor body 38. For example, providing the additional diffusion barrier layer 66 may include providing a mask (not shown) over the gate oxide layer 60 and any exposed portions of the surface of the semiconductor body 38, providing the additional diffusion barrier layer 66, and subsequently removing the mask (not shown). Further, the mask (not shown) used to deposit the gate oxide layer 60, the diffusion barrier layer 64, and the channel mobility enhancement layer 58 may also be re-used to selectively provide the additional diffusion barrier layer 66. Finally, the gate electrode 62 is provided over the additional diffusion barrier layer 66 (step 610 and FIG. 17F). The gate electrode 62 may be provided by any suitable deposition or growth process without departing from the principles described herein.

Figure 17G:
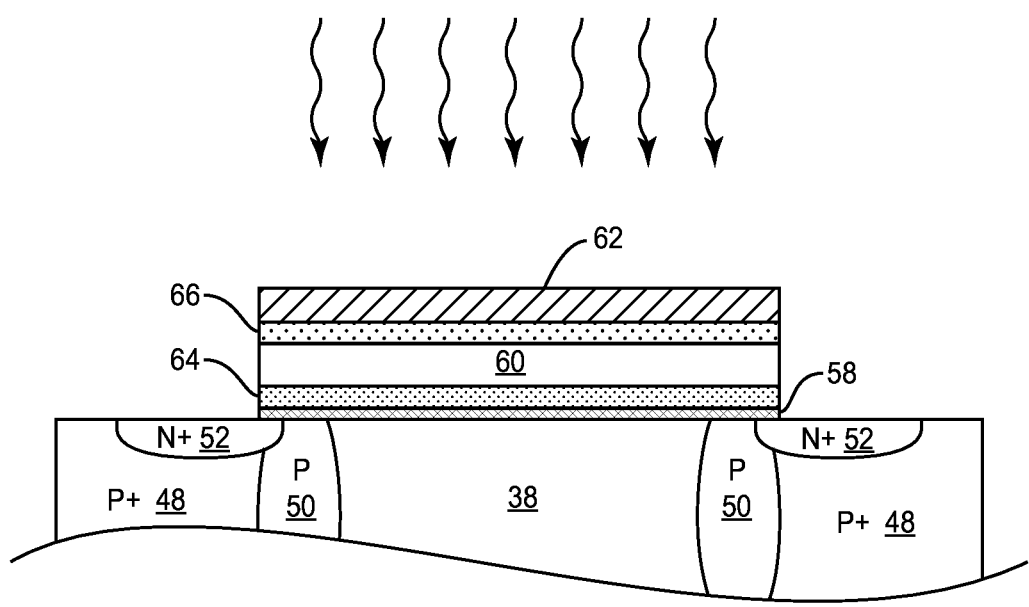

Either before or after providing the additional diffusion barrier layer 66 and the gate electrode 62, the diffusion barrier layer 64 and the gate oxide layer 60 are annealed to densify the dielectric (step 612 and FIG. 17G). Annealing the gate oxide layer 60 may include exposing the gate oxide layer 60, the diffusion barrier layer 64, the channel mobility enhancement layer 58, and the semiconductor body 38 to heat (represented by the wavy lines in FIG. 17G). In the process of annealing the gate oxide layer 60, all or a portion of the diffusion barrier layer 64 and the additional diffusion barrier layer 66 may oxidize to become part of the gate oxide layer 60. In some embodiments, the annealing process may be precisely controlled to oxidize as much of the diffusion barrier layer 64 as possible while preventing diffusion of byproducts from the channel mobility enhancement layer 58 into the gate oxide layer 60. Further, all or a portion of the additional diffusion barrier layer 64 may oxidize to become part of the gate oxide layer 60 and/or reduced to become a conducting layer. In some embodiments, the annealing process may be precisely controlled to oxidize or reduce as much of the additional diffusion barrier layer 66 as possible while preventing diffusion of byproducts from the gate electrode 62 into the gate oxide layer 60.

Those skilled in the art will recognize improvements and modifications to the preferred embodiments of the present disclosure. All such improvements and modifications are considered within the scope of the concepts disclosed herein and the claims that follow.

What is claimed is:

1. A method of forming an insulated gate contact for a semiconductor device comprising:
   providing a semiconductor body;
   providing one or more junction implants in the semiconductor body;
   providing a channel mobility enhancement layer over an active channel formed in the one or more junction implants in the semiconductor body, wherein the channel mobility enhancement layer is configured to increase a channel mobility of the semiconductor device;
   providing a diffusion resistant layer on the channel mobility enhancement layer, wherein the diffusion resistant layer is resistant to diffusion of byproducts from the channel mobility enhancement layer;
   oxidizing at least a portion of the diffusion resistant layer to form a dielectric layer; and
   providing a bulk offset region over a portion of the semiconductor body that is between the semiconductor body and a portion of the channel mobility enhancement layer.

2. The method of claim 1 further comprising providing a gate electrode over the oxidized portion of the diffusion resistant layer.

3. The method of claim 1 wherein the channel mobility enhancement layer is one of potassium, rubidium, cesium, strontium, barium, lanthanum, scandium, phosphorus, arsenic, antimony, bismuth, vanadium, niobium, tantalum, and mixtures of the same.

4. The method of claim 3 wherein the diffusion resistant layer is comprised of one or more of poly-silicon, aluminum, magnesium, and related elements which can form good dielectrics upon oxidation or nitridation.

5. The method of claim 1 wherein the diffusion resistant layer is comprised of one or more of poly-silicon, aluminum, magnesium, and related elements which can form good dielectrics upon oxidation or nitridation.

6. The method of claim 1 wherein the semiconductor body is a wide bandgap semiconductor material.

7. The method of claim 1 further comprising oxidizing a substantial portion of the diffusion resistant layer from the top-down to form a dielectric layer.

8. The method of claim 1 further comprising providing a first diffusion barrier layer between the channel mobility enhancement layer and the diffusion resistant layer.

9. The method of claim 8 further comprising providing a second diffusion barrier layer on the dielectric layer.

10. The method of claim 1 wherein the bulk offset region is laterally spaced from the active channel.

11. A method of forming an insulated gate contact for a semiconductor device comprising:
    providing a semiconductor body;

providing one or more junction implants in the semiconductor body;

providing a channel mobility enhancement layer on a surface of the semiconductor body over an active channel formed in the one or more junction implants of the semiconductor body, wherein the channel mobility enhancement layer is configured to increase a channel mobility of the semiconductor device;

providing a first diffusion barrier layer on the channel mobility enhancement layer, wherein the first diffusion barrier layer is resistant to diffusion of byproducts from the channel mobility enhancement layer;

providing a dielectric layer on the first diffusion barrier layer;

providing a gate electrode on the dielectric layer;

providing a second diffusion barrier layer between the dielectric layer and the gate electrode; and providing a bulk offset region over a portion of the semiconductor body that is between the semiconductor body and a portion of the channel mobility enhancement layer.

12. The method of claim 11 further comprising oxidizing at least a portion of the first diffusion barrier layer to form a dielectric material.

13. The method of claim 11 wherein the channel mobility enhancement layer is one of potassium, rubidium, cesium, strontium, barium, lanthanum, scandium, phosphorus, arsenic, antimony, bismuth, vanadium, niobium, tantalum, and mixtures of the same.

14. The method of claim 13 wherein the first diffusion barrier layer is one of silicon, aluminum, silicon oxide, aluminum oxide, magnesium oxide, silicon nitride, and mixtures of the same.

15. The method of claim 11 wherein the dielectric layer is one of silicon oxide, silicon nitride, aluminum oxide, magnesium oxide, and mixtures of the same.

16. The method of claim 11 wherein the first diffusion barrier layer is one of silicon oxide, aluminum oxide, magnesium oxide, silicon nitride, and mixtures of the same.

17. The method of claim 11 wherein the semiconductor body is a wide bandgap semiconductor material.

18. The method of claim 11 further comprising providing a diffusion resistant layer on the first diffusion barrier layer and oxidizing at least a portion of the diffusion resistant layer to form the dielectric layer, wherein the diffusion resistant layer comprises poly-silicon.

19. The method of claim 11 wherein the bulk offset region is laterally spaced from the active channel.

* * * * *